United States Patent [19]

Bramanti

[11] Patent Number: 4,675,615
[45] Date of Patent: Jun. 23, 1987

[54] MAGNETIC AMPLIFIER

[76] Inventor: Donato Bramanti, 50016 S. Domenico Di Fiesole, Via Vecchia Fiesolana 40, Italy

[21] Appl. No.: 814,263

[22] Filed: Dec. 30, 1985

[51] Int. Cl.⁴ .................. H03F 9/00; G01L 1/14; G01R 33/04

[52] U.S. Cl. .................. 330/8; 33/DIG. 13; 73/DIG. 2; 73/862.64; 324/253; 336/20; 336/110; 336/184; 336/215

[58] Field of Search ............... 330/8, 60, 63; 324/244, 324/253; 336/20, 110, 170, 184, 215; 33/DIG. 13; 73/862.64, 862.68, DIG. 2

[56] References Cited

U.S. PATENT DOCUMENTS 4,339,792  7/1982  Yasumura et al. ............ 323/248 X

OTHER PUBLICATIONS

Brueckner et al., "Cross Field Three-Phase Magnetic Amplifier," *IBM Technical Disclosure Bulletin*, vol. 21, No. 10 Mar. 1979, p. 3954.
Van Der Heide, "A Magnetic Amplifier For The Visual Presentation of Low-Frequency Hysteresis Loops of Very Small Ferromagnetic Samples", *IEEE Transactions On Magnetics*, vol. 1, Jun. 1965 pp. 87–90.

Primary Examiner—James B. Mullins
Attorney, Agent, or Firm—Wolf, Greenfield & Sacks

[57] ABSTRACT

A magnetic amplifier employing a single four-legged ferrite core having orthogonally disposed through holes in the core. Biasing is provided of the magnetic core so as to provide operation in the non-linear parts of the core's hysteresis cycle. A first coil on the ferromagnetic core has an AC excitation signal applied thereto and a second coil on the core is wound orthogonally to the first coil and is adapted to have an output signal derived therefrom. A control or input current in a third coil is used to unbalance the magnetic bridge formed by the four legs, so as to produce a mutual inductance different from zero between the first and second coil. The biasing may be provided by a fourth coil or by permanent magnet means.

18 Claims, 11 Drawing Figures

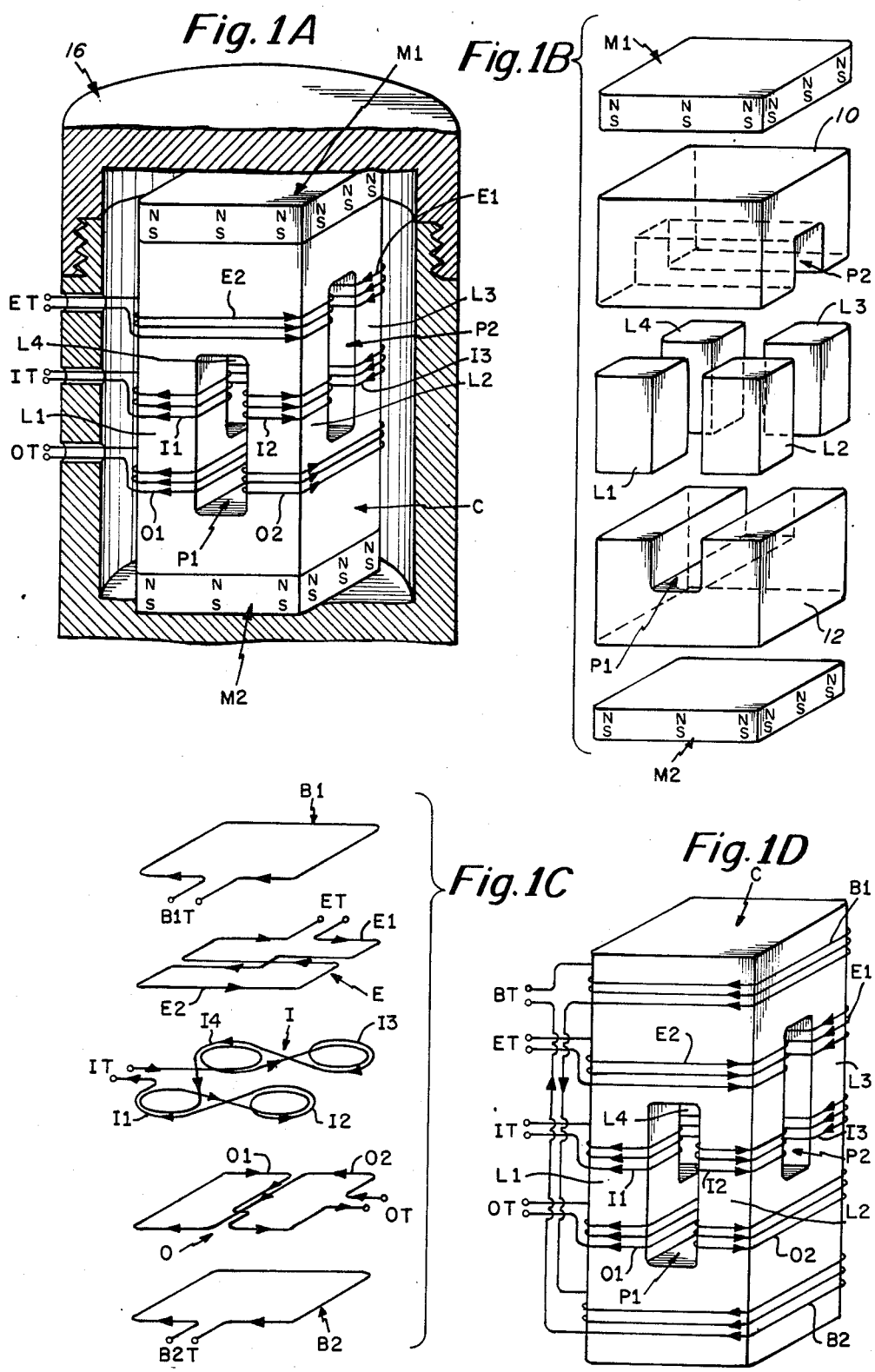

MAGNETIC AMPLIFIER

BACKGROUND OF THE INVENTION

The present invention relates in general to magnetic apparatus, and pertains, more particularly, to a new construction of magnetic amplifier. Even more particularly, the invention pertains to a magnetic amplifier with a single multi-legged ferrite core operating on the principle of a saturable mutual inductance bridge. The principles of the present invention may also be employed in the construction of magnetometers and of magnetostrictive strain meters, or, in general, to the construction of devices to be used for the detection and measurement of any physical phenomenon, producing small magnetic signals in the core of the magnetic amplifier itself.

With regard to prior art patents relating to the field of magnetic amplifiers in general, the following are typical: U.S. Pat. Nos. 2,164,383; 3,015,073; 3,271,690; 4,286,211; 3,801,907; and 4,339,792. Of the foregoing patents, the latter U.S. Pat. No. 4,339,792 is typical and illustrates a multi-leg ferrite core construction. However, it is noted that this device is not used for signal amplification. It appears to be used as a regulator in connection with a power supply. Also, in most of these prior patents, it is noted that they make use of rectifiers in the excitation circuit which is not necessary in accordance with the principles of the present invention. In accordance with the present invention, the legs of the core are operating on both halves of the cycle. Another magnetic amplifier related to the background of the present invention is described in: IEEE Transactions on Magnetics, vol 1, June 1965, pp 87-90.

The above referred to prior art patents and publication operate on the principle of saturable reactors or inductors in which the effect of the non-linear magnetic material reflects on the same coil on which the excitation current is sent, or in another coil that is strongly coupled to it. On the other hand, in accordance with the present invention, the principle of operation is one of unbalancing a bridge of four saturable mutual inductances, and in which the effect of the non-linear material takes place in an output coil that becomes coupled to the excitation coil only when the input current is different from zero.

Accordingly, it is an object of the present invention to provide an improved magnetic amplifier characterized by improved amplifier gain.

Another object of the present invention is to provide a magnetic amplifier with a single multi-legged ferrite core and that one embodiment has a magnetic amplification with a power gain of 100 for a predetermined frequency range. The power gain is here defined, for small input signals, as the ratio between the power obtainable from the output coil (at the expense of the excitation power) and the power dissipated into the input coil.

Still another object of the present invention is to provide an improved magnetic amplifier that is relatively simple in construction, that can be constructed and operated with ease, and that operates on the principle of saturable mutual inductance bridge.

SUMMARY OF THE INVENTION

To accomplish the foregoing and other objects, features and advantages of the invention, there is provided a magnetic amplifier apparatus, which in the preferred embodiment thereof, is in the form of a magnetic amplifier with a single four-legged ferrite core. This apparatus comprises a ferromagnetic core having multiple core legs defined at least in part by orthogonally disposed through holes in the core. The ferromagnetic core is selected so as to have a hysteresis cycle or hysteresis curve with suitable non-linear operating segments. Means are providing for biasing the ferromagnetic core to these non-linear operating segments of the hysteresis cycle. There is provided a first coil means on the ferromagnetic core and means for applying an AC excitation signal to this first coil means. A second coil means is also provided on the ferromagnetic core and is wound orthogonally to the first coil means. Means are provided for deriving an output signal from the second coil means. In the preferred embodiment, there is also provided a third coil means on the ferromagnetic core and means for applying a control signal to this third coil means. With regard to the coil means, the first coil means is wound on the core through the first hole in a first direction while the second coil means is wound on the core through the second hole in a second direction generally orthogonal to the winding in the first direction. The third coil means is wound on the core through both first and second holes. The third coil means preferably includes separate control coils on each leg, two wound in a clockwise direction and two wound in a counter clockwise direction. The clockwise coils are diagonally disposed and similarly the counter clockwise coils are also physically diagonally disposed. The means for biasing the core may either be in the form of a pair of polarizing magnets, one at each axial end of the core or may comprise a fourth coil means wound in two sections on the outside of the core for the biasing thereof.

BRIEF DESCRIPTION OF THE DRAWINGS

Numerous other objects, features and advantages of the invention should now become apparent upon a reading of the following detailed description taken in conjunction with the accompanying drawing, in which:

FIG. 1A is a perspective view showing one form of magnetic amplifier in accordance with the present invention employing a single four-legged ferrite core and permanent magnets for biasing;

FIG. 1B is also a perspective view illustrating the ferrite core without windings and illustrating a version in which the core is constructed in separate pieces;

FIG. 1C illustrates the various coil configurations associated with the ferrite core;

FIG. 1D is a perspective view similar to that illustrated in FIG. 1A, but without shield for clarity and further showing the biasing being carried out by coil means rather than permanent magnets;

DETAILED DESCRIPTION

Figure 2A:
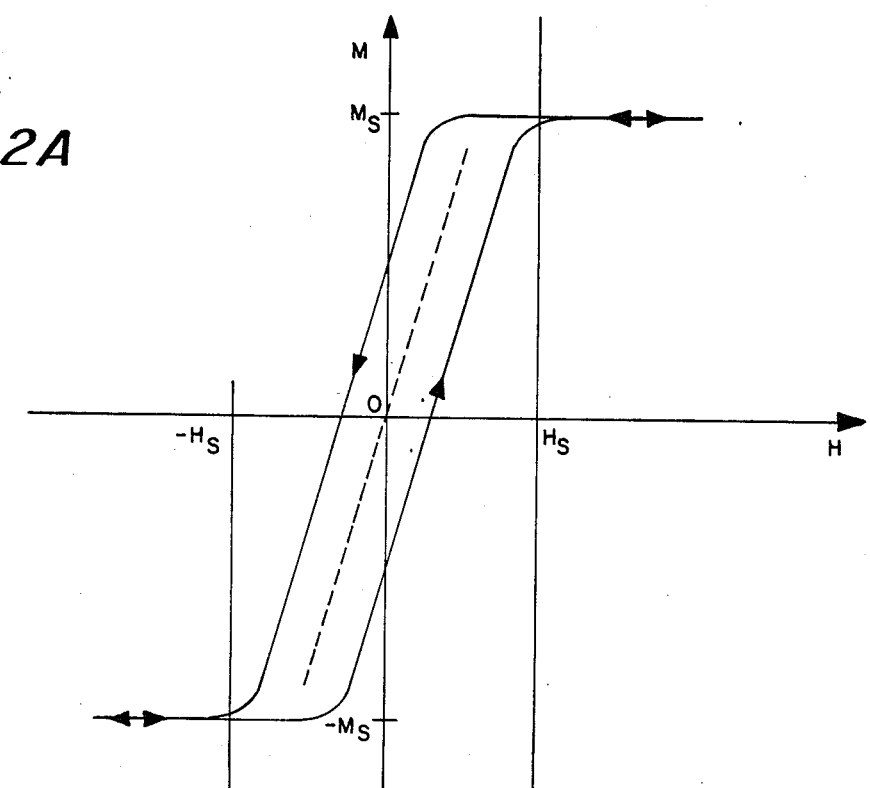
FIG. 2A illustrates a hysteresis curve or hysteresis cycle for the ferromagnetic core and in particular the legs of the core.

One embodiment of the present invention is illustrated in FIG. 1A in the form of a single four-legged ferrite core having disposed at either end, permanent magnets M1 and M2. The core C is provided with transversely disposed passages P1 and P2. FIG. 1A also illustrates the multiple coils that are associated with the ferrite core. FIG. 1A illustrates the excitation terminals ET, the input terminals IT, and the output terminals OT. Because in the embodiment of FIG. 1A the biasing is provided by the permanent magnets M1 and M2, there is no separate set of bias terminals and associated bias coil.

The device illustrated in FIGS. 1A and 1B is in the form of a bridge of four variable mutual inductances formed by the saturable legs of a single four-legged ferromagnetic (ferrite) core. The legs are identified as legs L1-L4. With regard to FIG. 1, the complete device is shown with the coils wound on the legs of the core. In this regard, it is noted that the through passages P1 and P2 are displaced by half of their length. Also, the cross-section of each hole in the core is approximately twice the cross-section of each leg. In FIG. 1A the core is shown built as a single piece. However, for the purpose of illustration and in an alternate embodiment, the ferrite core may be constructed of separate pieces as illustrated in FIG. 1B. These pieces include four separate legs L1-L4 made of a saturable magnetic material along with the top piece 10 and the bottom piece 12 made of the same material or of a less saturable one. It may be easier to construct the core in the embodiment of FIG. 1B, however, it is important that the various components be accurately matched so as to avoid air gaps in the magnetic circuit. For this purpose, the securing together of the various pieces is to be carried out with an adhesive that has proper magnetic characteristics.

Reference is now made to FIG. 1C which shows a series of perspective views illustrating the form of the four coils that can be wound on the core. These include the bias coil B, the excitation coil E, the input or control coil I and the output coil O. It is noted that the bias coil is composed of two loops B1 and B2 although they may be in multiple turns. Similarly, the other coils may also be shown in multiple turns. With regard to the excitation coil, this is illustrated in two loops E1 and E2. Note in this regard also the placement of the excitation coil on the core in FIG. 1A. The input coil is separated into four loops identified as loops I1, I2, I3, and I4. Finally, the output coil is separated into separate loops O1 and O2.

The bias coil is wound outside of the core in equal section, B1 and B2, around the places that in FIG. 1A were occupied by the magnets. In this regard, refer to FIG. 1D which shows the placement for the bias coil. It is noted that in the embodiment of FIG. 1D, because of the use of a bias coil, there are no permanent magnets employed. Either the bias coil or the magnets are used, but not both together.

As indicated previously, the excitation coil loops E1 and E2 of FIG. 1C are illustrated on the core in FIG. 1A. Similarly, the output loops O1 and O2 are also illustrated on the core. It is noted that the excitation loops are only associated with the passage P2 while the output loops are only associated with the passage P1. On the other hand, the control loops I1-I4 are associated respectively with the legs L1-L4 and are adapted to extend through both passages P1 and P2. From FIG. 1C it is noted that the loops I1 and I3 are clockwise loops while the loops I2 and I4 are counter clockwise loops. This provides the proper magnetic control for unbalancing the magnetic bridge formed by the four legs.

In accordance with the present invention, the magnetic amplifier makes use of the non-linear characteristics of the hysteresis cycle of the ferrogmagnetic material comprised of the legs of the core. In this regard, refer to FIG. 2A which shows a preferred form of the hysteresis curve as plotted on the typical axes in which the horizontal axis represents magnetic field (applied) and the vertical axis represents magnetization, or flux density. The ideal material of the core should have a hysteresis cycle with the steepest possible slope and with a relatively low saturation value in order to reduce the intensities of the currents needed to operate the device. The width of the hysteresis cycle is to be as small as possible in order to reduce the magnetic dissipation. These parameters can be selected by the proper selection of the ferromagnetic material.

Figure 2B:
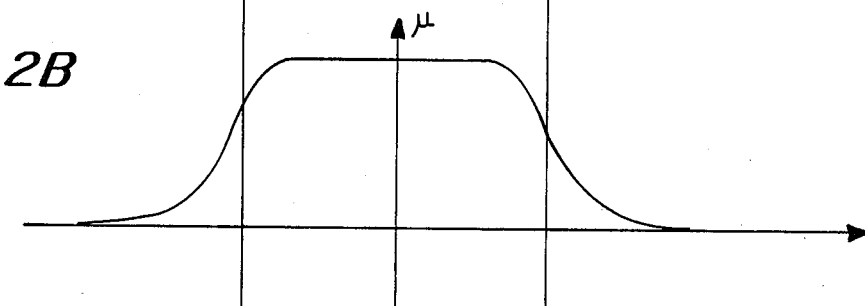
FIG. 2B illustrates an additional characteristic associated with the hysteresis cycle of FIG. 2A and in particular illustrating the magnetic permeability (average) as a function of magnetic field.

FIG. 2B is a plot of permeability versus magnetic field. Permeability is a ratio of magnetization to magnetic field. As indicated in FIG. 2B the permeability is at a maximum in the steep parts of the hysteresis cycle, and then decreases asymptotically toward the baseline as the magnetic field is increased.

Figure 2C:
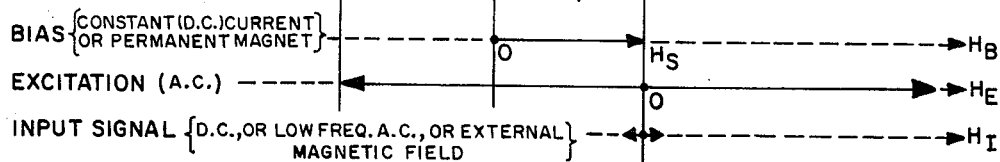
FIG. 2C illustrates the values of the magnetic fields $H_B$, $H_E$ and $H_I$ produced by the bias, excitation and input currents, respectively, that are needed to operate the magnetic amplifier.

FIG. 2C illustrates line diagrams. A first one shows the bias magnetic field which illustrates biasing so as to provide a quiescent operating point at the non-linear portion of the hysteresis cycle or at about the midpoint of the permeability curve as it transitions from maximum to baseline. The second diagram in FIG. 2C illustrates the alternating magnetic field due to the AC excitation current. Lastly, there is illustrated the input or control signal which may be constant or variable at low frequency.

When the magnetic field H is increased above a certain value, $H_s$, the magnetization in the legs reaches a saturation value $M_s$ and the magnetic permeability of the material decreases as illustrated in FIG. 2B. This occurs for both magnetic field $H_s$ positive and $H_s$ negative. If the legs of the core are magnetized at these values of $H_s$ by means of an appropriate polarizing $I_b$ in coil B, or by means of the permanent magnets, it is possible to vary the permeability of the legs by means of another current in coil I (input or control coil). The control current is constructed in such a way that the current therein decreases the permeability of the two opposite legs and increases the permeability of the other two. As indicated previously, this is carried out by means of the diagonally disposed clockwise and counter clockwise windings of the control coils. In this way the mutual inductance bridge formed by the four legs becomes unbalanced. Therefore, the AC current flowing in the coil E (excitation coil) and producing an alternating magnetic field $H_E$ with a constant peak-to-peak value of about four times $H_s$ induces an alternating current $I_o$ in the output coil O.

Figure 3:
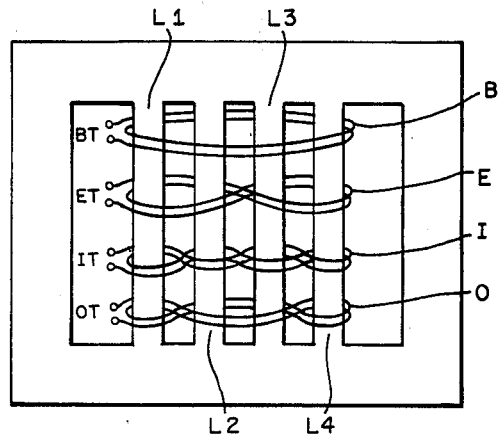
FIG. 3 is a schematic diagram illustrating the four legs of the magnetic amplifier core with the associated coil windings.

The four circuits illustrated in FIG. 1C for bias, input, excitation and output are preferably constructed so that they are each electrically insulated from the other. The number of turns of coils of each circuit may be planned so as to match the impedance of the external circuits to which it is connected. Capacitors may be connected in parallel to the coil terminals to further improve this matching, so as to obtain the maximum efficiency. Reference is also now made to FIG. 3 which is a schematic diagram for illustrating the understanding of operation of the magnetic apparatus of this invention. The geometry of FIG. 3 is not the optimal, it is only for the purpose of illustration. FIG. 3 illustrates the four separate winding circuits and also the associated legs L1–L4. In principle of operation, the different circuits are in a sense, equivalent to one another and can be more or less freely interchanged. Their function is determined mainly by the type of current that is sent into each of them.

In FIG. 3, even if the rods or legs L1–L4 are made of a non-linear (ferromagnetic) material, each circuit is also inductably independent from the others, taken singly or in pairs: i.e. by sending a current (DC or AC) in any one of the windings, nothing is derived from the other three; by sending two currents (equal or different, DC or AC) in any two circuits, nothing is derived from the other two; however, if one sends three appropriate currents in any three of the windings, an output different from zero is obtained from the fourth winding or circuit. Of course, in the above explanation, it is assumed that any bias is provided by one of the coils and not by permanent magnets.

Figure 4A:
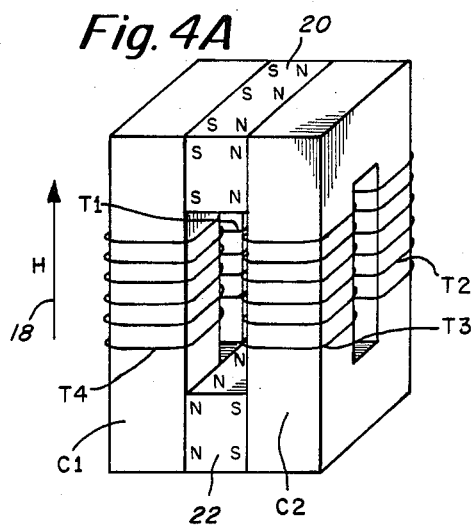
FIG. 4A illustrates a perspective view of an alternate embodiment of the present invention as applied to a magnetometer and employing four legs with two coil configurations, one for excitation and one for output and including permanent magnets as part of the core structure.
Figure 4B:
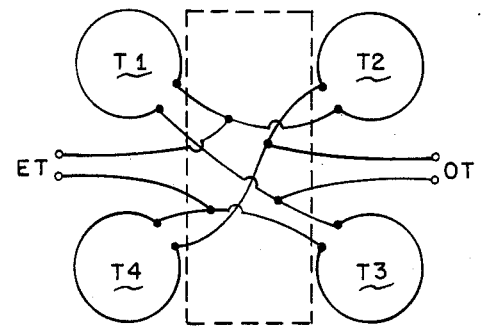
FIG. 4B illustrates the coil configurations for the excitation and output coils associated with the core of FIG. 4A.

The coils of two circuits can also be combined together in a bridge configuration with only one coil on each leg as illustrated in FIGS. 4A and 4B. Note in FIG. 4B the excitation terminal ET and the output terminal OT and the bridge comprised of loops T1–T4. This arrangement forms an inductance bridge. In this arrangement, the circuits are not electrically insulated, but they do maintain the above-mentioned inductive properties. In planning such bridge connections of the coils care must be taken to avoid the formation of unwanted loops which behave with respect to other circuits operating with alternating currents like a short-circuited secondary in an ordinary transformer.

When a circuit has to be used with a constant direct current only (a biasing current), it may be advantageous to replace one of the coils by appropriate permanent magnets inserted directly into the core. Two ways of carrying this out are illustrated. One way has been referred to hereinbefore in FIG. 1A. When the device is used as a magnetic amplifier as in FIG. 1A, the magnets in M1 and M2 are disposed at axial ends of the core. In this arrangement, there is also preferably provided an external cylindrical ferromagnetic structure 16, both for closing the magnetic circuit B (biasing current or magnets) and secondly for shielding the device from external magnetic and electric disturbances.

Now, in connection with the embodiment of the invention illustrated in FIG. 4A, it is noted that the device is operated as a magnetometer, since it amplifies magnetic signals produced in the four legs by external magnetic fields, and obviously no shield is to be used in this version. Thus, the external magnetic field H as indicated by the arrow 18 influences directly the four legs in the same way as the permanent magnets illustrated in FIG. 1A. In the circuit of FIG. 4A, rather than having permanent magnets at either axial end of the structure, there are provided magnets 20 and 22 that essentially separate the core into two separate magnetic circuits C1 and C2. Thus, the magnetometer contains only two electric circuits, the excitation and the output which can be combined in a bridge configuration. Again, FIG. 4B shows how this can be done and how the coils must be placed with respect to the magnets 20 and 22 shown in dotted rectangular outline in FIG. 4B.

Figure 5:
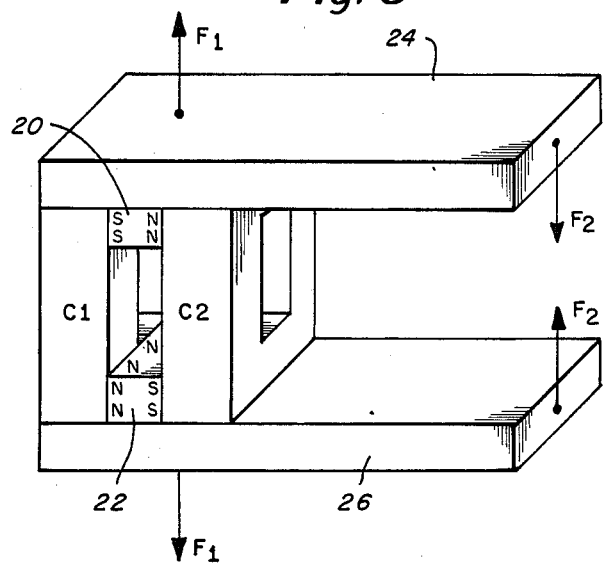
FIG. 5 illustrates the principles of the present invention as applied to a magnetostrictive strain meter as used in the measurement of forces.

If the device of FIG. 4A is constructed with a magnetostrictive material, it is then sensitive to strains, because they produce variations of the permeability and of the magnetization of the four legs. If the two lateral pieces C1 and C2, as illustrated in FIG. 5, are constructed of the same magnetostrictive material, then the device illustrated in FIG. 5 is sensitive to bending strains such as those due to the forces F2 on the non-magnetic members 24 and 26. If the pieces C1 and C2 have opposite magnetostrictive coefficients, the device is sensitive to longitudinal strains such as those due to the forces F1 in FIG. 5.

In accordance with the present invention, it is important to make the legs of the core equal in size and shape. Also to make the coils substantially of equal configuration so that the bridge is properly balanced. The final fine zero adjustment may be obtained by very slightly displacing the polarizing magnets. If this system is well balanced, no output is obtained when the input current $I_i$ equals zero. When $I_i$ does not equal zero, there will be an output which is of the same frequency of the excitation current and its amplitude is linearly proportional to the input current $I_i$. This type of output may be referred to as a suppressed carrier modulated signal.

In accordance with one version of the present invention that has been tested, the power gain of the signal, with a single piece ferrite core has been about 100 and was constant for a control current $I_i$ ranging in frequency from DC to about 10 KHz. In this instance, the excitation frequency was 100 KHz. For higher control frequencies the amplification diminishes. This amplification has been obtained without feedback. A feedback can increase the amplification by a large factor and may be added to the device very simply by demodulating the output signal and by sending part of the current so obtained into the input circuit, with appropriate polarity, or into another circuit wound in the same way.

The magnetic amplifier described herein may be constructed in relatively small size. In one version, the overall apparatus with coils and polarizing magnets, but without shield, was less than one cubic centimeter and its weight was 3.5 grams. By using a higher quality ferrite, operating at a higher excitation frequency, it is possible to amplify higher input frequencies and build small devices, useful for amplifying small currents.

Having now described a limited number of embodiments of the present invention, it should now be apparent to those skilled in the art that numerous other embodiments and modifications thereof are contemplated as falling within the scope of the present invention as defined by the appended claims.

What is claimed is:
1. Magnetic apparatus comprising;
   a ferromagnetic core having multiple core legs defined at least in part by orthogonally disposed through holes in the core, means for biasing the ferromagnetic core to the nonlinear operating segments of the hysteresis cycle,
first coil means on the ferromagnetic core,
means for applying an AC excitation signal to said first coil means,
second coil means on the ferromagnetic core and wound orthogonally to said first coil means,
means deriving an output signal from said second coil means,
third coil means on the ferromagnetic core and means for applying a control signal to said third coil means,
said ferromagnetic core has four legs defined by a pair of orthogonally disposed holes including first and second holes,
said first coil means would on the core through said first hole in a first direction,
said second coil means wound on the core through said second hole in a second direction generally orthogonal to said first direction,
said third coil means wound on the core through both said first and second holes.

2. Magnetic apparatus as set forth in claim 1 wherein said third coil means includes separate control coils on each leg, two wound in a clockwise direction and two wound in a counter clockwise direction.

3. Magnetic apparatus as set forth in claim 2 wherein the clockwise coils are diagonally disposed and the counter clockwise coils are also diagonally disposed.

4. Magnetic apparatus as set forth in claim 3 wherein the first and second holes are disposed to cross but are axially displaced one to the other.

5. Magnetic apparatus as set forth in claim 4 wherein said means for biasing comprises a pair of polarizing magnets, one at each axial end of the core.

6. Magnetic apparatus as set forth in claim 4 wherein said means for biasing comprises a fourth coil means wound on the outside of the core.

7. Magnetic apparatus as set forth in claim 1 wherein said means for biasing comprises a pair of polarizing magnets, one at each axial end of the core.

8. Magnetic apparatus as set forth in claim 1 wherein said means for biasing comprises a fourth coil means wound on the outside of the core.

9. Magnetic apparatus as set forth in claim 1 wherein said orthogonally disposed through holes are disposed to cross but are axially displaced one to the other.

10. Magnetic apparatus comprising;
a first magnetic circuit having a first through hole therein defining a first pair of magnetic circuit legs,
a second magnetic circuit having a first through hole therein defining a second pair of magnetic circuit legs,
means for completing the circuit between said first and second magnetic circuits including first and second permanent magnets, one at each end of the first and second magnetic circuits,
said first and second permanent magnets disposing the first and second magnetic circuits in spaced relationship so as to form a second through hole orthogonal to said first through holes,
continuous coil means would on said first and second pairs of magnetic circuit legs,
means for applying an excitation signal to said coil means, and means for deriving an output signal from said coil means.

11. Magnetic apparatus as set forth in claim 10 wherein the coil means comprises four separate coil loops, one disposed about each of the magnetic circuit legs in a bridge configuration having opposite sides.

12. Magnetic apparatus as set forth in claim 11 wherein the excitation signal is applied across a first side of said bridge.

13. Magnetic apparatus as set forth in claim 12 wherein the output signal is derived across a second side of said bridge.

14. Magnetic apparatus as set forth in claim 10 wherein said magnetic apparatus is a magnetometer for measuring external magnetic fields.

15. Strain sensing apparatus comprising;
a first magnetostrictive circuit having a first through hole therein defining a first pair of circuit legs,
a second magnetostrictive curcuit having a first through hole therein defining a second pair of circuit legs,
means for completing the circuit between said first and second magnetostrictive legs including first and second permanent magnets, one at each end of the first and second magnetostrictive circuits,
said first and second permanetnt magnets disposing the first and second magnetostrictive circuits in spaced relationship so as to form a second through hole orthogonal to said first through holes,
a pair of non-magnetic members, one attached to each end of the first and second magnetostrictive circuits and having forces imparted thereto,
continuous coil means wound on said first and second pairs of magnetostrictive circuit legs,
means for applying an excitation signal to said coil means,
and means for deriving an output signal from said coil means representative of strain from said applied forces.

16. Strain sensing apparatus as set forth in claim 15 wherein the first and second magnetostrictive circuits are constructed of the same magnetostrictive material to measure bending strains.

17. Strain sensing apparatus as set forth in claim 15 wherein the first and second magnetostrictive circuits are constructed of opposite magnetostrictive coefficient material to measure longitudinal strains.

18. Strain sensing apparatus as set forth in claim 15 wherein said non-magnetic members are both cantileverd out from said magnetotrictive circuits.

* * * * *